US012601764B2

(12) United States Patent
Becker

(10) Patent No.: US 12,601,764 B2
(45) Date of Patent: Apr. 14, 2026

(54) ELECTRIC CIRCUIT ARRANGEMENT AND METHOD FOR THE GALVANICALLY SEPARATE, AC/DC-SENSITIVE RESIDUAL-CURRENT MEASUREMENT

(71) Applicant: Bender GmbH & Co. KG, Gruenberg (DE)

(72) Inventor: Pascal Becker, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 193 days.

(21) Appl. No.: 18/502,217

(22) Filed: Nov. 6, 2023

(65) Prior Publication Data

US 2024/0151748 A1 May 9, 2024

(30) Foreign Application Priority Data

Nov. 8, 2022 (DE) ..................... 10 2022 129 457.9

(51) Int. Cl.
*G01R 15/18* (2006.01)
*G01R 19/25* (2006.01)
*G01R 35/00* (2006.01)

(52) U.S. Cl.
CPC ........... *G01R 15/183* (2013.01); *G01R 19/25* (2013.01); *G01R 35/005* (2013.01)

(58) Field of Classification Search
CPC ..... G01R 15/183; G01R 19/25; G01R 35/005
See application file for complete search history.

(56) References Cited

U.S. PATENT DOCUMENTS

| | | | |
|---|---|---|---|
| 2012/0318359 A1* | 12/2012 | Laird | H10K 85/211 |
| | | | 977/734 |
| 2013/0279050 A1 | 10/2013 | Kinsel | |

(Continued)

FOREIGN PATENT DOCUMENTS

| | | |
|---|---|---|
| CN | 104655919 B | 8/2017 |
| DE | 19739815 C1 | 11/1998 |

(Continued)

OTHER PUBLICATIONS

Office Action issued against corresponding German Application No. 10 2022 129 457.9; mailed Aug. 29, 2023; In German with English Machine Translation (15 pages).

(Continued)

*Primary Examiner* — Alesa Allgood
(74) *Attorney, Agent, or Firm* — Fitch, Even, Tabin & Flannery, LLP

(57) ABSTRACT

An electric circuit arrangement and to a measuring method for the galvanically separate, AC/DC-sensitive residual-current measurement, the measuring method including registering a residual current (Id) by means of a measuring current transformer having a toroid and precisely one secondary winding; supplying power to the secondary winding and generating a time-modulated, binary measuring signal (V) having a corresponding dwell time (Th, T1) in a first state (S1) and a second state (S2) by means of a driver circuit having an oscillation circuit; evaluating the dwell times (Th, T1) by means of a computing unit and outputting a residual-current measured value (Im, I'm) by a data interface, wherein the driver circuit having the oscillation circuit forms an integral structural unit in the form of a driver module, which is supplied with a shared, unipolar operating voltage (Ub) by a power-supply device together with the computing unit.

9 Claims, 3 Drawing Sheets

(56) References Cited

U.S. PATENT DOCUMENTS

Figure 1:
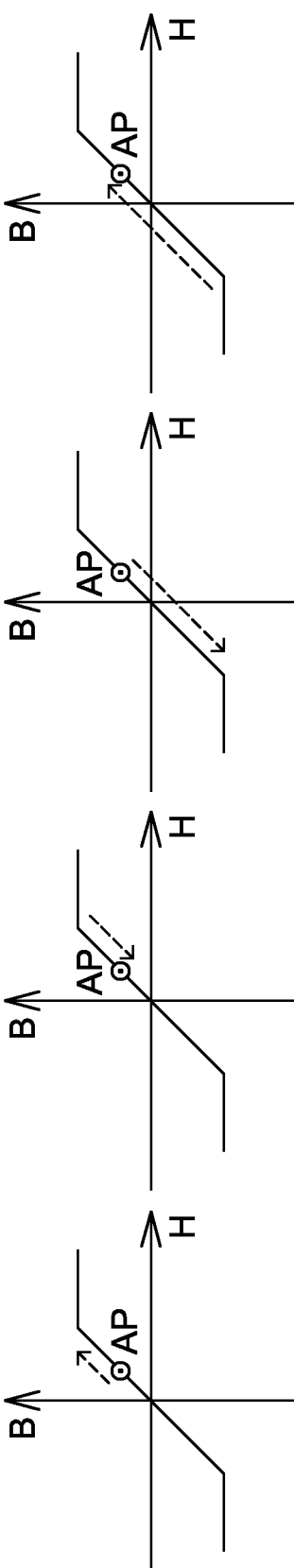

| 2014/0021939 | A1 * | 1/2014 | Dobrenko | ........... | G01R 15/185 |
| | | | | | 324/127 |
| 2014/0361765 | A1 | 12/2014 | Hackl | | |
| 2021/0311154 | A1 | 10/2021 | Schuberth | | |
| 2021/0318359 | A1 | 10/2021 | Becker | | |
| 2022/0276283 | A1 | 9/2022 | Boettcher | | |

FOREIGN PATENT DOCUMENTS

| DE | 60207632 | T2 | 7/2006 | | |
| DE | 102011002756 | A1 | 7/2012 | | |
| DE | 112010001977 | T5 | 11/2012 | | |
| DE | 102021104752 | A1 | 9/2022 | | |
| EP | 2 653 875 | A1 | 10/2013 | | |
| EP | 2813856 | B1 | 1/2016 | | |
| EP | 3121609 | A1 * | 1/2017 | ............. | G01R 31/52 |
| EP | 3121609 | B1 | 9/2021 | | |
| EP | 3893006 | A1 | 10/2021 | | |

OTHER PUBLICATIONS

EPO Search Report issued against corresponding Application No. 23205673.9-1001; mailed Mar. 18, 2024; In German with English Machine Translation (22 pages).

* cited by examiner

Fig. 3

ELECTRIC CIRCUIT ARRANGEMENT AND METHOD FOR THE GALVANICALLY SEPARATE, AC/DC-SENSITIVE RESIDUAL-CURRENT MEASUREMENT

CROSS-REFERENCE TO RELATED APPLICATION

This application claims priority from German Patent Application Number 10 2022 129 457.9, filed on Nov. 8, 2022, which is hereby incorporated herein by reference in its entirety for all purposes.

FIELD

The invention relates to an electric circuit arrangement and to a method for the galvanically separate, AC/DC-sensitive residual-current measurement, the electric circuit arrangement consisting of a measuring current transformer having a toroid and precisely one secondary winding for registering a residual current, a driver circuit having an oscillation circuit for supplying power to the secondary winding and for generating a time-modulated, binary measuring signal having a corresponding dwell time in a first state and a second state, and of a computing unit having a data interface for evaluating the dwell times and for outputting a residual-current measured value.

BACKGROUND

Known are measuring devices and measuring methods for monitoring electric installations based on the residual-current measuring principle. Measuring devices of this kind are based on the fact that the vectorial sum of the currents (primary current) equals zero on all active conductors of a supply line, in particular on the line of a power supply system, during fault-free operation of an electric installation, thus no magnetic field exists in a magnetizable toroid of a measuring current transformer enclosing the supply line. If, however, a fault current which discharges outside of the supply line arises, e.g., due to an insulation fault, then a residual current is yielded on the primary side. A variable magnetic flux caused within the toroid by this residual current induces a voltage in a secondary winding of the measuring current transformer, the magnitude of this voltage allowing to make a statement about the magnitude of the residual current.

If the residual current is particularly small, as in the case of preventively identifying a fault current caused by a steadily deteriorating insulation state of the power supply system, a measuring device having high sensitivity is required. Other fields of application from the field of fault-current monitoring, e.g., for registering a test current pulse in ungrounded power supply system can therefore also require being able to register even particularly small residual currents in the range of maximally 300 mA at a high resolution.

Known methods for AC/DC-sensitive residual-current measurement by means of a measuring current transformer, as disclosed in the patent document EP 2 813 856 B1, use oscillation circuits, by means of which the magnetization curve of the transformer core of the measuring current transformer is passed in an oscillating manner by a controlled, secondary-side current flow between an upper and a lower saturation. From the temporal curve of this oscillation, two states may be defined and a measured variable may be formed from determining the dwell times in the corresponding state, the primary-side residual current being able to be determined from the measured variable via the measuring current transformer. However, in the patent documents mentioned above, an application-specific integrated circuit (ASIC) is used which makes much development effort and high initial costs necessary.

Patent application EP 3 893 006 A1 also discloses an electric circuit arrangement and a method for the galvanically separate, AC/DC-sensitive residual-current measurement, which is based on a driver circuit for supplying power to a toroid current transformer and on a first oscillation circuit for controlling the driver circuit. The oscillation signal is evaluated in high resolution by means of a clock signal, which is generated in a structurally separate second oscillation circuit and thus requires further hardware work.

Furthermore, patent document CN104655919B shows a quasi-digital DC current sensor for measuring high current based on a multivibrator circuit, which has an operational amplifier as a comparator for generating a bipolar exciting current for supplying a non-linear measuring transformer with power. The alternating exciting current is transformed to a positive pulse-shaped signal whose pulse duty factor is evaluated based on microprocessors. However, the current sensor is not suited for measuring small, AC/DC-sensitive residual currents at high resolution because of its alignment with a high-current DC absolute current.

Moreover, the discrete circuit structure of the multivibrator circuit requires another defined power supply aside from the power supply to the microprocessor.

SUMMARY

The object of the invention is therefore to create an electric circuit arrangement and a measuring method for the galvanically separate, AC/DC-sensitive residual-current measurement, which both allow measuring a residual current preferably in the range of maximally 300 mA and allow flexibly evaluating the measured values, while simultaneously being able to be implemented efficiently from a circuitry and an economical point of view.

In connection with the features of the preamble in claim 1, this object is attained by the driver circuit together with the oscillation circuit forming an integral structural unit in the form of a driver module configured to be supplied with a shared, unipolar operating voltage by a power-supply device together with the computing unit.

For registering the residual current, the electric circuit arrangement according to the invention has a measuring current transformer having a toroid (toroid transformer), whose magnetization curve shows a distinct positive and negative saturation range, between which an approximatively linear range extends. The toroid transformer has precisely one secondary winding (measuring winding), which is supplied with power by a driver circuit having an oscillation circuit and generates a time-modulated, binary measuring signal having a corresponding dwell time in a first state and a second state.

For this purpose, the driver circuit is controlled by the oscillation circuit in such a manner that the magnetization curve is passed in an oscillating manner in both directions of the linear range between the positive and the negative saturation as a result of the current flowing through the secondary winding.

The differentiation between the linear range and the corresponding saturation range on the magnetization curve is made in the oscillation circuit by measuring the value of the secondary current and being compared to a sufficiently high (secondary-current) saturation threshold which corresponds to a current value in the saturation range of the toroid material.

If the secondary current exceeds the saturation threshold, the oscillation circuit flips and the direction of electric current in the secondary winding is reversed.

By evaluating the zero points of the secondary current, i.e., in the operating point on the magnetization curve determined solely by the residual current, and from its flipping points, i.e., in the saturation ranges on the magnetization curve, a time-modulated, binary measuring signal having dwell times in a first state (high phase) and in a second state (low phase) can be derived from the curve of the secondary current.

Starting from the operating point on the magnetization curve pre-specified by the residual current until reaching the corresponding saturation point as a function of the position of the operating point, the dwell times in the first state and in the second state are of differing duration and thus lead to the temporally modulated, binary measuring signal.

The passing of the magnetization curve is thus mapped in the dwell times of the time-modulated, binary measuring signal via a function as linear as possible (linear range of the magnetization curve), the dwell times corresponding to the passed paths on the magnetization curve being yielded as a function of the operating point.

The time-modulated, binary measuring signal (oscillation signal) therefore has high and low phases (first state and second state) of varying durations depending on the position of the operating point and thus as a function of the residual current.

The evaluation of the measuring signal consists of determining the corresponding dwell time in the first/second state via a clock signal and is carried out by means of a computing unit, which is preferably designed as a microprocessor.

The use of a programmable computing unit of this kind and consequently the software-based evaluation advantageously offer an increased flexibility regarding the adaption to different measuring transformer variations and enable a simple and quick change of the measuring parameters, such as a measuring resolution adapted to the measuring range.

The number of clock pulses counted within the corresponding dwell times with the clock signal leads to a direct component, which is proportional to the residual current and yields the residual-current measured value, after a suitable signal processing (low-pas filtering).

This residual-current measured value is output via the data interface.

According to the invention, the driver circuit having the oscillation circuit forms an integral structural unit in the form of a driver module. The driver module is designed such that it is supplied with the same, unipolar operational voltage as the computing unit. For this purpose, the electric circuit arrangement has a shared power-supply device, which merely has to provide an operational voltage which is the same for the driver module and the computing unit, whereby the circuitry complexity is reduced according to the task of the invention. In particular, no switch relay is required, which in turn has a positive effect on the electromagnetic compatibility (EMC).

Preferably, the driver module is configured to reverse the direction of electric current in the secondary winding by changing the polarity at the secondary winding.

By changing the polarity at the secondary winding, only a unipolar voltage supply is required. The direction of electric current in the secondary winding is reversed as a result of the change in polarity, and the magnetic flux in the toroid is driven from the current saturation range back to the corresponding opposite saturation.

Advantageously, the data interface is configured to output the residual-current measured value in digital form and/or in analog form by means of a digital-to-analog converter.

For further processing or an optical/acoustic representation, the residual-current measured value is provided as a digital signal at the outlet of the computing unit via the data interface or as an analog signal in conjunction with a digital-to-analog converter integrated in the computing unit.

In another embodiment, the measuring current transformer has a test and calibration winding.

The test and calibration winding allows a functional testing and a calibration of the electric circuit arrangement.

Preferably, the test and calibration winding has the same number of windings as the secondary winding.

In this embodiment, the measuring winding (secondary winding) and the test and calibration winding are realized similarly with few windings, meaning they can be produced in the same work step, thus leading to a simplification in production.

The object of the invention is further attained by a measuring method for the galvanically separate, AC/DC-sensitive residual-current measuring.

The claimed measuring method describes the method steps implemented by the electric circuit arrangement according to the invention for the AC/DC-sensitive determination of the residual current. Thus far, the technical effects mentioned above for the electric circuit arrangement and the advantages resulting therefrom also apply to the method features.

Combining the driver circuit with the oscillation circuit as an integral driver module on the one hand, in conjunction with the evaluation of the dwell times by means of a microprocessor-oriented computing unit on the other hand, present an efficient implementation from a circuitry and economical point of view, this implementation requiring only a unipolar power source, while simultaneously allowing adapting the measuring parameters to the measuring task with a flexible evaluation of the measured values.

BRIEF DESCRIPTIONS OF THE DRAWINGS

Further advantageous embodiment features are derived from the following description and the drawings, which exemplarily describe a preferred embodiment of the invention.

Figure 2:
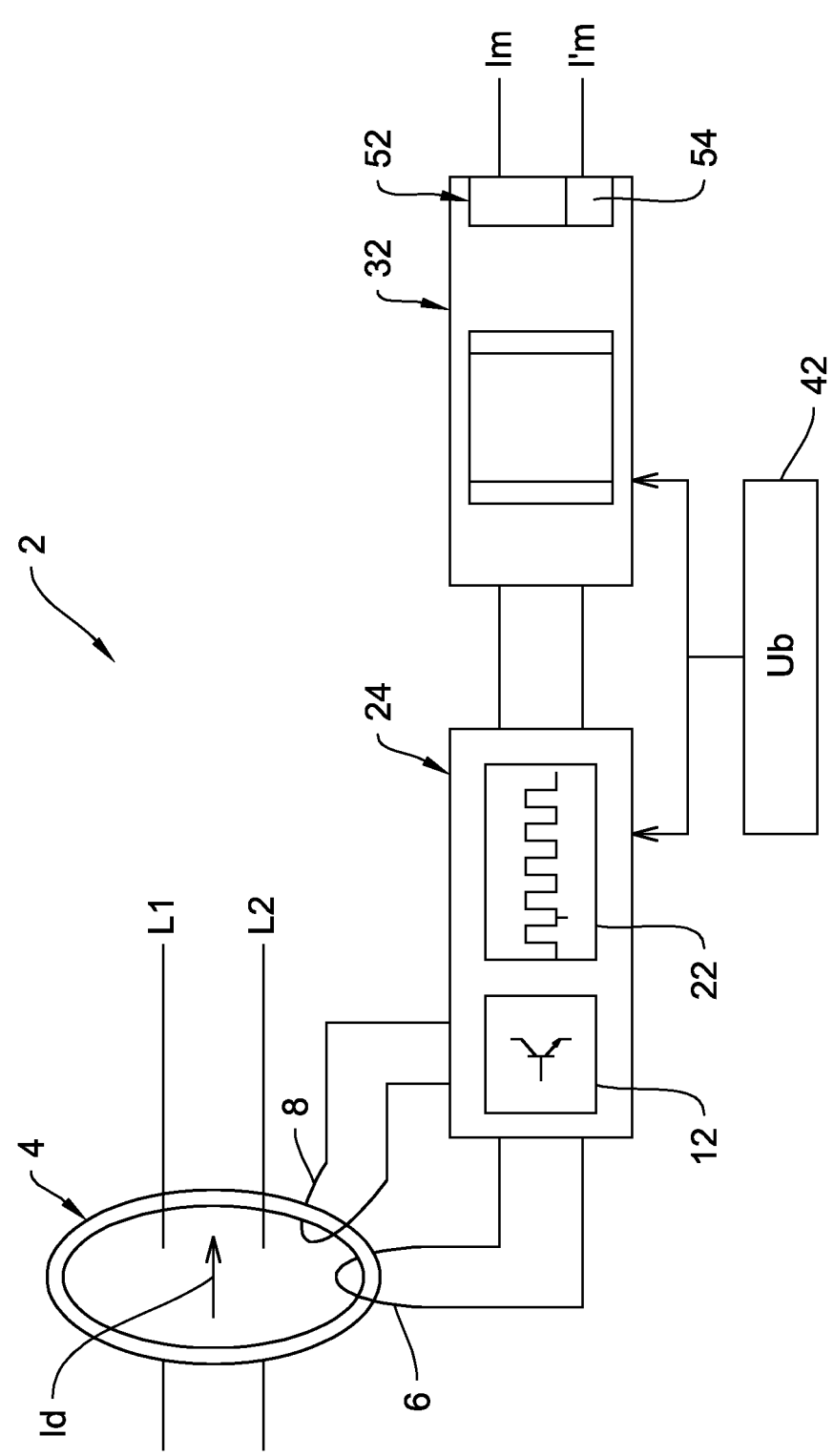

FIG. 1 schematically shows a passing of magnetization curve of a measuring current transformer;

FIG. 2 shows a functional block diagram of the electric circuit arrangement according to the invention; and FIG. 3 shows a signal flow based on the measuring method.

DETAILED DESCRIPTION

In FIG. 1, a passing of a magnetization curve of the measuring current transformer (toroid current transformer) 4 (FIG. 2) is schematically shown.

The magnetization curve represents magnetic induction B as a function of magnetic field strength H and consists of a linear section which extends between an upper and a lower saturation range.

Starting from operating point AP pre-specified by residual current $I_d$ (FIG. 2), the magnetization curve is first passed by an increasing current in secondary winding 6 (FIG. 2) in the direction of the positive saturation state. In operating point AP, the value of the current (secondary current) flowing in secondary winding 6 equals zero, meaning operating point AP is determined only by residual current $I_d$ flowing on the primary side. The reaching of the saturation range is identified by a value measurement of the secondary current and by the comparison to a sufficiently high saturation threshold, which is in the saturation range of the toroid material. If the secondary current exceeds this saturation threshold, the oscillation circuit flips. The polarity of the secondary winding is then reversed and magnetic flux B in the toroid is driven from the saturation range back to the corresponding opposite saturation.

Passing the magnetization curve makes it clear that the corresponding duration of an increasing and decreasing secondary current, i.e., dwell times $T_h$, $T_1$ (FIG. 3), depend on the position of operating point AP on the magnetization curve. Consequently, the knowledge of the zero point and the flip points of the secondary current allows deriving a time-modulated, binary measuring signal V (oscillation signal) (FIG. 3) having dwell times $T_h$, $T_1$ in a first state $S_1$ and a second state $S_2$ (FIG. 3).

FIG. 2 shows a functional block diagram of electric circuit arrangement 2 according to the invention.

(Alternating or direct) residual current $I_d$ (primary current) to be measured is registered by toroid current transformer 4, whereby a specific operating point AP is set on the magnetization curve (FIG. 11). Residual current $I_d$ can, for example, be yielded owing to a fault current in a direct-voltage power supply system or in a one-phase or multi-phase alternating-voltage power supply system, the power supply system being able to be a grounded or an ungrounded power supply system. Shown exemplarily are two active conductors L1, L2 of a power supply system, which, acting as a primary winding, are enclosed by the toroid of measuring current transformer 4.

For passing the magnetization curve in both directions, toroid current transformer 4 has a secondary winding 6, which is supplied with power by a driver circuit 12.

For this purpose, either the voltage [0 V and Ub] (FIG. 2) in state $S_1$ (FIG. 3) or the voltage [Ub and 0 V] having reversed polarity in state $S_2$ (FIG. 3) are applied to the corresponding winding ends of secondary winding 6 via a current-limiting series resistance (not shown). This makes it possible to cover both directions of electric current via a simple reversal of polarity (change in polarity), without requiring an additional voltage source, for instance having negative voltage. Operational voltage Ub (FIG. 2) is preferably 3.3 V, but may also be 3 V or 5 V or adopt a value in this range.

Magnetic field strength H connected to the current flow in secondary winding 6 generates magnetic induction B in the toroid material.

In contrast to the DC current sensors, which are known from the prior art for high-current measurement and are configured for reaching a sufficiently large saturation induction flow having a secondary-winding number of N=1000 and a correspondingly large inductivity, secondary coil 6 used for the invention at hand has a winding number in the range of N=10 to 100 and a resulting low inductivity. This allows digital signal processing of the secondary current at a high sampling rate in the range of several thousand, thus being suitable for measuring low residual currents in the range of maximally 300 mA according to the task.

The toroid of measuring current transformer 4 is provided with a test and calibration winding 8, which is realized having the same number of windings as secondary winding 6 and serves for the functional testing and calibration of electric circuit arrangement 2.

Driver circuit 12 is controlled by an oscillation circuit 22, an oscillation signal V (FIG. 3) being obtained by evaluating the zero points and the flip points of the secondary current in secondary winding 6.

The passing of the magnetization curve is consequently shown in dwell times $T_h$, $T_1$ (FIG. 3) having a first state $S_1$ (high phase) and having a second state $S_2$ (low phase), dwell times $T_h$, $T_1$ corresponding to the paths to be passed on the magnetization curve being yielded as a function of operating point AP pre-specified by residual current $I_d$.

If, for example, operating point AP is close to the upper saturation point on the linear path section of the magnetization curve as a consequence of a relatively high residual current $I_d$, a shorter path is passed on the linear section when passing the magnetization curve starting from operating point AP than when the residual current is lower—a shorter dwell time is the result. As explained above, binary measuring signal V time-modulated in this manner therefore has dwell times $T_h$, $T_1$ of differing durations in states $S_1$ and $S_2$ depending on the position of operating point AP and thus as a function of residual current $I_d$.

According to the invention, driver circuit 12 and oscillation circuit 22 form an integral structural unit in the form of a driver module 24. Driver module 24 is supplied with the same shared, unipolar operational voltage Ub as computing unit 32 by a power-supply device 42.

The evaluation of dwell times $T_h$, $T_1$ consists of determining the duration of corresponding dwell time $T_h$, $T_1$ and is carried out by a clock signal generated in computing unit 32.

Computing unit 32 is designed as a microprocessor, whose programming allows a flexible and quick adaption to the corresponding measuring task determined, for example, by the measuring range and the measuring environment.

On the outlet side, computing unit 32 provides a residual-current measured value $I_m$ proportional to residual current $I_m$ via a data interface 52. This residual-current measured value $I_m$ can be output directly in digital form $I_m$ via data interface 52 and/or as a residual-current measured value $I'_m$ by means of a digital-to-analog converter 54.

Figure 3:
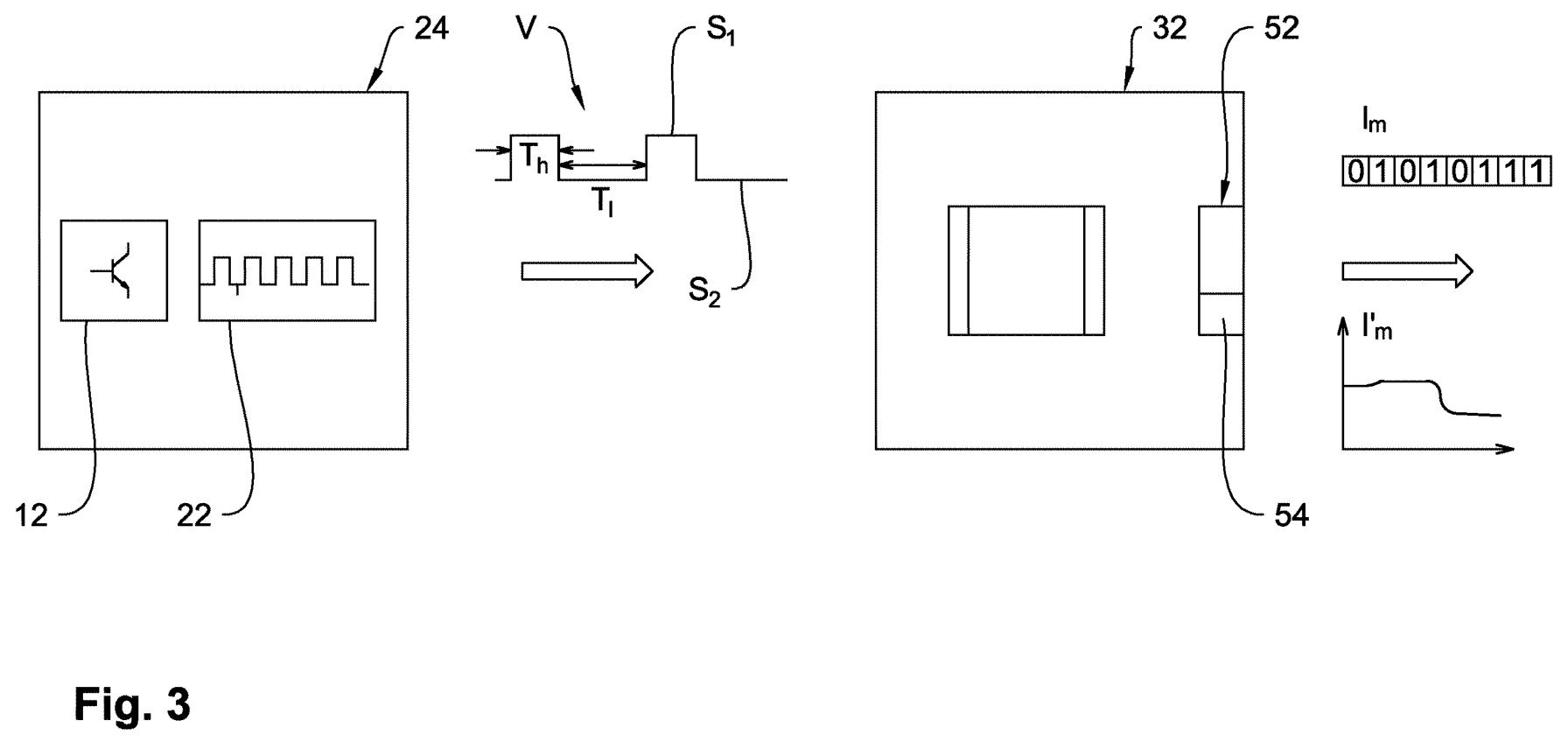

FIG. 3 shows a signal flow based on the measuring method.

Time-modulated, binary measuring signal V generated in driver module 24 is forwarded to computing unit 32 and is evaluated there by a software by setting programmable measuring parameters, such as the measuring resolution or the measuring range.

Residual-current measured value $I_m$ thus computed from dwell times $T_h$, $T_1$ is provided for further processing or representation via data interface 52 directly as digital residual-current measured value $I_m$ and/or as analog residual-current measured value $I'_m$ via digital-to-analog converter 54.

The invention claimed is:

1. An electric circuit arrangement for galvanically separate, AC/DC-sensitive residual-current measurement, the electric circuit arrangement consisting of:

a measuring current transformer having a toroid and precisely one secondary winding for registering a residual current, a driver circuit having an oscillation circuit for supplying power to the secondary winding and for generating a time-modulated, binary measuring signal having a corresponding dwell time in a first state and a second state,

a computing unit having a data interface for evaluating the dwell times and for outputting a residual-current measured value, wherein the driver circuit having the oscillation circuit forms an integral structural unit in the form of a driver module configured to be supplied with a shared, unipolar operating voltage by a power-supply device together with the computing unit.

2. The electric circuit arrangement according to claim 1, wherein the driver module is configured to reverse the direction of electric current in the secondary winding by changing the polarity at the secondary winding.

3. The electric circuit arrangement according to claim 1, wherein the data interface is configured to output the residual-current measured value in digital form and/or in analog form by a digital-to-analog converter.

4. The electric circuit arrangement according to claim 1, wherein the measuring current transformer has a test and calibration winding.

5. The electric circuit arrangement according to claim 4, wherein the test and calibration winding has the same number of windings as the secondary winding.

6. A measuring method for the galvanically separate, AC/DC-sensitive residual-current measurement, the method comprising the method steps of:

registering a residual current by a measuring current transformer having a toroid and precisely one secondary winding, supplying power to the secondary winding and generating a time-modulated, binary measuring signal having a corresponding dwell time in a first state and a second state by a driver circuit having an oscillation circuit, evaluating the dwell times by a computing unit and outputting a residual-current measured value by a data interface, wherein the driver circuit having the oscillation circuit forms an integral structural unit in the form of a driver module, which is supplied with a shared, unipolar operating voltage by a power-supply device together with the computing unit.

7. The measuring method according to claim 6, wherein the direction of electric current in the secondary winding is reversed via a change of polarity at the secondary winding by the driver module.

8. The measuring method according to claim 6, wherein that the residual-current measured value is output in digital form via the data interface and/or in analog form by a digital-to-analog converter.

9. The measuring method according to claim 6, wherein the measuring current transformer is tested and calibrated by a test and calibration winding.

* * * * *